United States Patent
Hild et al.

(10) Patent No.: US 9,153,783 B2
(45) Date of Patent: Oct. 6, 2015

(54) ORGANIC DEVICE AND MANUFACTURING METHOD THEREOF

(71) Applicant: FRAUNHOFER-GESELLSCHAFT ZUR FOERDERUNG DER ANGEWANDTEN FORSCHUNG E.V., Munich (DE)

(72) Inventors: Olaf R. Hild, Radebeul (DE); André Philipp, Radeberg (DE); Tae-hyun Gil, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/228,969

(22) Filed: Mar. 28, 2014

(65) Prior Publication Data

US 2014/0291650 A1 Oct. 2, 2014

(30) Foreign Application Priority Data

Mar. 28, 2013 (DE) .............................. 102013205714

(51) Int. Cl.
*H01L 51/40* (2006.01)
*H01L 51/00* (2006.01)
*H01L 51/52* (2006.01)
*H01L 27/32* (2006.01)

(52) U.S. Cl.
CPC ........ *H01L 51/0011* (2013.01); *H01L 51/0016* (2013.01); *H01L 51/5209* (2013.01); *H01L 27/3246* (2013.01)

(58) Field of Classification Search
CPC ............ H01L 51/0541; H01L 51/0545; H01L 51/0036; H01L 51/5012
USPC ................................ 257/40, E51.001; 438/99
See application file for complete search history.

(56) References Cited

U.S. PATENT DOCUMENTS

| 8,354,669 B2 | 1/2013 | No et al. |
| 2001/0045921 A1 | 11/2001 | Uchida et al. |
| 2004/0113545 A1 | 6/2004 | Pang et al. |
| 2007/0048624 A1* | 3/2007 | Chen et al. ........................ 430/3 |
| 2009/0322923 A1 | 12/2009 | Maehara |

FOREIGN PATENT DOCUMENTS

| DE | 10343351 | 5/2005 |
| DE | 102011005528 A1 | 12/2011 |
| WO | 2005/119808 A2 | 12/2005 |
| WO | 2011018110 A1 | 2/2011 |

* cited by examiner

*Primary Examiner* — Anthony Ho
(74) *Attorney, Agent, or Firm* — Michael A. Glenn; Perkins Coie LLP (57) ABSTRACT

A method for manufacturing an organic device includes the steps of applying a photoresist onto at least an active first region arranged on a substrate of the organic device, and removing the photoresist from the substrate in a second region adjacent to the active first region. Additionally, the method includes the steps of applying a passivation layer onto the first and second regions and removing the photoresist and the passivation layer in the active first region.

12 Claims, 14 Drawing Sheets

ORGANIC DEVICE AND MANUFACTURING METHOD THEREOF

CROSS-REFERENCE TO RELATED APPLICATIONS

This application claims priority from German Patent Application No. 102013205714.8, which was filed on Mar. 28, 2013, and is incorporated herein by reference in its entirety.

BACKGROUND OF THE INVENTION

Embodiments of the present invention relate to a method for manufacturing an organic device, to an organic device, to an optical display comprising such a device, and to the usage of the optical display as an optical viewfinder.

Organic devices are exemplarily used as organic transistors (OFETs) or organic light-emitting diodes (OLEDs). OLEDs exhibit low a current consumption and high flexibility with regard to the field of application. OLEDs may be miniaturized to a degree such that same may be used for display purposes, exemplarily in optical viewfinders of cameras.

Special or specially adapted manufacturing methods are used for manufacturing the very small structures or patterns which are frequently necessitated here, exemplarily in the micrometer range, many of these manufacturing methods being based on classical lithographic processes.

An example of such an adapted manufacturing method is producing a so-called electrode edge protection, exemplarily when producing passive matrix displays. Producing the electrode edge protection takes place by means of lithographic processes. Feed lines and/or edges of electrodes here are covered by an insulating resist which may be patterned lithographically so as to provide a kind of protective film for subsequent manufacturing processes. Examples of resists of this kind are polyamide photoresists, such as, for example, TORAY and photoneece, or conventional photoresists. Of disadvantage in this method is the long-term stability of the passivation and stability towards cleaning procedures, such as, for example, ultrasonic cleaning. Another disadvantage is the fact that water is released as a consequence of temperature influence and/or storage. Additionally, photoresists are only suitable to a limited degree for applications necessitating high transparency, since photoresists are optically visible and typically exhibit a thickness of several micrometers.

A method for connecting microscopic OLEDs in series is described in a patent document (WO 2010/1005844 A2). Here, an insulator is applied in between electro regions produced on a substrate in order to allow edge insulation. A sputtering process performed on a microscopic scale, with the aid of shadow masks, may be employed for this process. Applying the insulator here, however, may take place before applying active layers or connecting structures. However, depositing through a shadow mask is not sufficiently precise for producing small (microscopic) OLED areas, in particular those of special geometries. This is why there is the need for an improved approach.

The object underlying the present invention is providing a concept for manufacturing an organic device which is optimized with regard to manufacturing cost, shaping, electrical and optical characteristics, in particular as regards transparency.

SUMMARY

According to an embodiment, a method for manufacturing an organic device may have the steps of: applying a photoresist onto at least an active first region arranged on a substrate of the organic device; removing the photoresist from the substrate in a second region adjacent to the active first region; applying a passivation layer onto the first and second regions over the entire area; and removing the photoresist and the passivation layer in the active first region so as to generate an insulation edge in the passivation layer.

According to another embodiment, an organic device may have: an active first region; a second region adjacent to the active first region; and a passivation layer in the second region, the electrical device in the second region exhibiting a degree of transparency of more than 75% and the electrical device in the active region exhibiting a degree of transparency of more than 40%, and wherein the active first region and/or the second region are free from photoresist.

Another embodiment may refer to an optical display having an organic device as mentioned above.

Another embodiment may refer to a usage of the optical display as mentioned above for an optical viewfinder.

Embodiments of the present invention provide a method for manufacturing an organic device. The method includes the steps of "applying a photoresist" at least onto an active first region arranged on a substrate of the organic device and "removing the photoresist" from the substrate in a second (lateral) region adjacent to the active first region. After this, "applying a passivation layer" onto the first and second regions is performed, before performing "removing the photoresist and the passivation layer" in the active first region (exemplarily by means of a lift-off process), exemplarily in a common step.

The present invention is based on the finding that organic structures may be manufactured highly efficiently using a combination of lithography and sputtering processes. Here, the future active structure is at first protected by a photoresist (patterned by exposure) and an edge insulation is applied over the entire area or, advantageously, sputtered. Alternatively, another (full-area) method of depositing the edge insulation would also be conceivable, exemplarily in vacuum by means of a CVD (chemical vapor deposition) method or an ALD/MLD (atomic layer deposition/molecule layer deposition) method. Subsequently, the photoresist is removed from the active region or the region provided for the active structure, together with the passivation layer applied in this region so as to produce a highly precisely patterned active region or highly precisely patterned insulation edges around same. Departing from these steps of the manufacturing method, micro-patterned OLEDs organic field-effect transistors (OFETs) or organic photo diodes (OPEDs) may then be manufactured using additional steps, without the potentially disturbing photoresist remaining in the device (chip).

In correspondence with further embodiments, the step of removing the photoresist and the passivation layer takes place by a so-called lift-off process, which exemplarily includes a wet-chemical photoresist etching step, wherein the passivation layer applied onto the photoresist is removed here at the same time. Additionally, it would also be conceivable for the photoresist to be removed by means of a so-called ashing process, such as, for example, $O_2$ plasma etching, wherein the photoresist region here is also exposed completely (meaning that the passivation layer is also removed).

Further embodiments relate to an organic device comprising an active first region and a second region adjacent to the active first region. Additionally, the organic device includes a passivation layer in the second region, wherein the electrical device in the active first region exhibits very high degree of transparency of more than 40%, since same is not impaired by photoresist remaining in the device. This offers the advantage that such organic devices, such as, for example, in the form of OLEDs, may be employed in optical applications. Examples of this are, for example, the optical viewfinder of a camera or the usage as cross lines in an optical viewfinder. The device described is particularly suitable for this, since it exhibits a high degree of transparency on the one hand and, at the same time, a very fine structure of the active region, on the other hand, which exemplarily is smaller than 500 μm or even smaller than 100 μm.

BRIEF DESCRIPTION OF THE DRAWINGS

Embodiments of the present invention will be discussed referring to the appended drawings, in which.

DETAILED DESCRIPTION OF THE INVENTION

Before embodiments will be discussed below in greater detail referring to the figures, it is to be pointed out that same elements and structures are provided with same reference numerals such that the description thereof is exchangeable or mutually applicable.

Figure 1:
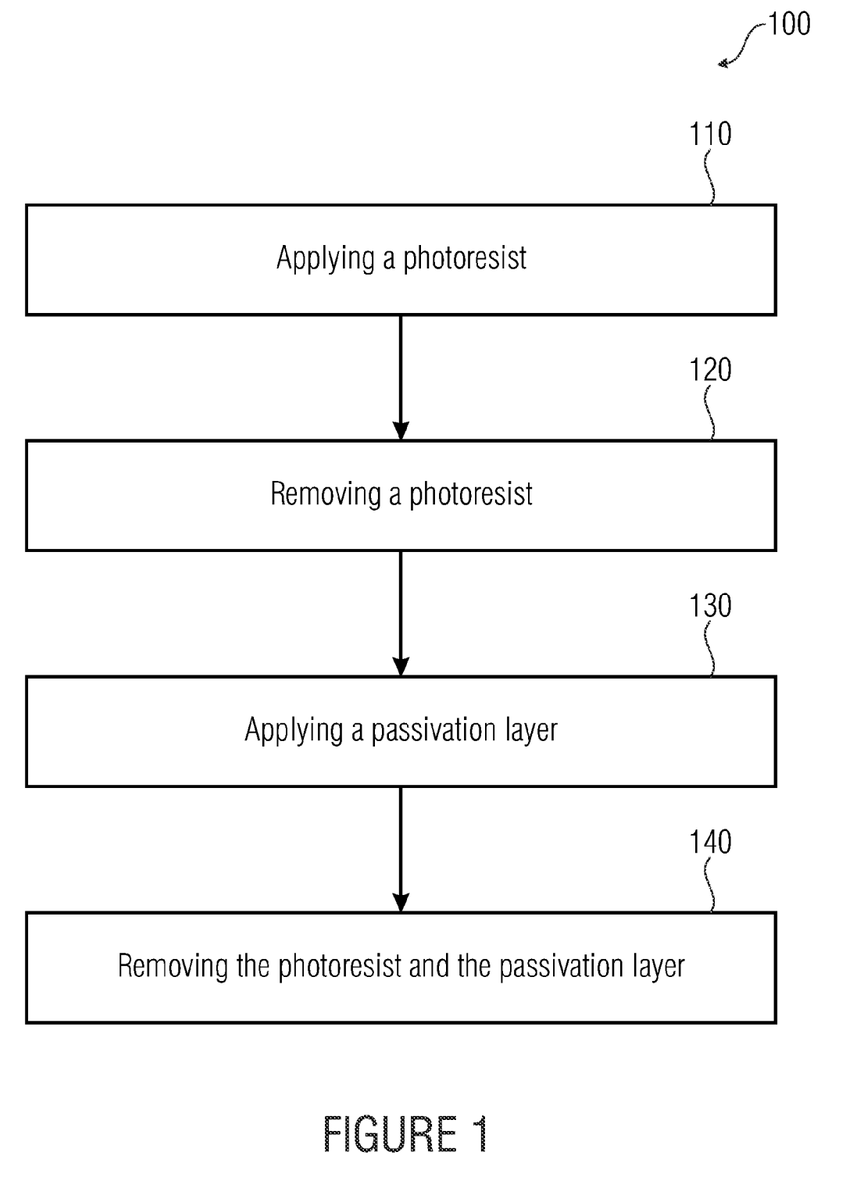
FIG. 1 shows a schematic flow chart of a method for manufacturing an organic device in accordance with an embodiment.

FIG. 1 shows a flow chart of a manufacturing method 100 including the four steps of "applying a photoresist" 110, "removing the photoresist" 120, "applying a passivation layer" 130 and "removing the photoresist and the passivation layer" 140. These four steps 110, 120, 130 and 140 represent the basic steps of the manufacturing method and will be described below in greater detail. For illustration purposes, the steps of the manufacturing method 100 will be discussed using the respective intermediate product forming, as are shown in FIGS. 2a to 2f.

Figure 2A:
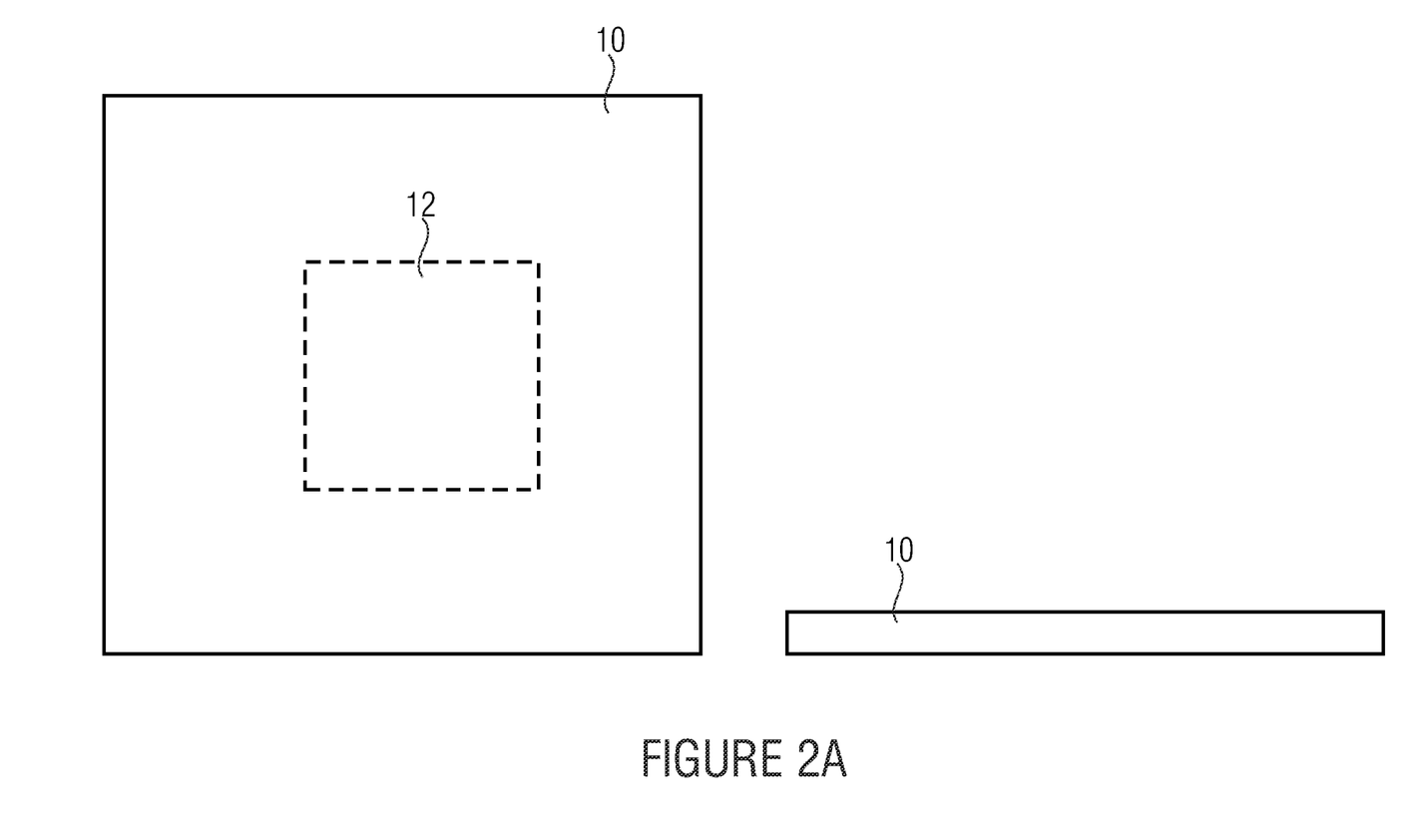
FIGS. 2a to 2f are schematic views of intermediate products of organic devices to be manufactured so as to illustrate the manufacturing method in accordance with embodiments.

In the first step 110, the method starts with a substrate 10 comprising a first active region 12, as is illustrated in FIG. 2a. Exemplarily, the substrate 10 may be a glass substrate, flexible substrate or transparent substrate. The active region 12 is defined by the fact that, after manufacturing the electrical or organic device, this is where the active layers (such as, for example, light-emitting layers in the case of an OLED) are arranged. A first (maybe active) layer 14, such as, for example, a (bottom) electrode for an OLED, may also have been applied already in this active region 12 (cf. FIG. 2b).

ITO (indium tin oxide) thinly deposited Al or Cu or another thin metal/metal combinations, such as, for example, Ca/Ag, or alloys (at a layer thickness of ≤20 nm) may exemplarily be used as a coating material for manufacturing the (bottom) electrode 14. Alternatively, MAM (molybdenum aluminum molybdenum), AZO (or different TCOs), graphenes, AgNw, CNTs, PEDOT: PSS, PANI or other conductive polymers may also be employed. Combinations of the materials or alloys thereof are also suitable for being used as the bottom electrode 14, wherein the materials selected depend on the respective application. Exemplarily, it is also possible here for the metal structure 14 to be implemented such that same may be used as a reflective electrode or a passive structural element. As may be recognized from FIG. 2b, the layer 14 here is patterned in the shape of a star. This patterning may exemplarily be done by means of lithography, wherein, however, other methods (not over the entire area), such as, for example, potential separation by means of laser, would also be feasible. As may also be gathered from FIG. 2b, the solid electrode 14 may comprise an extension in the form of a feed line 14a which extends from the active region 12 to the edge region 24.

Figure 2B:
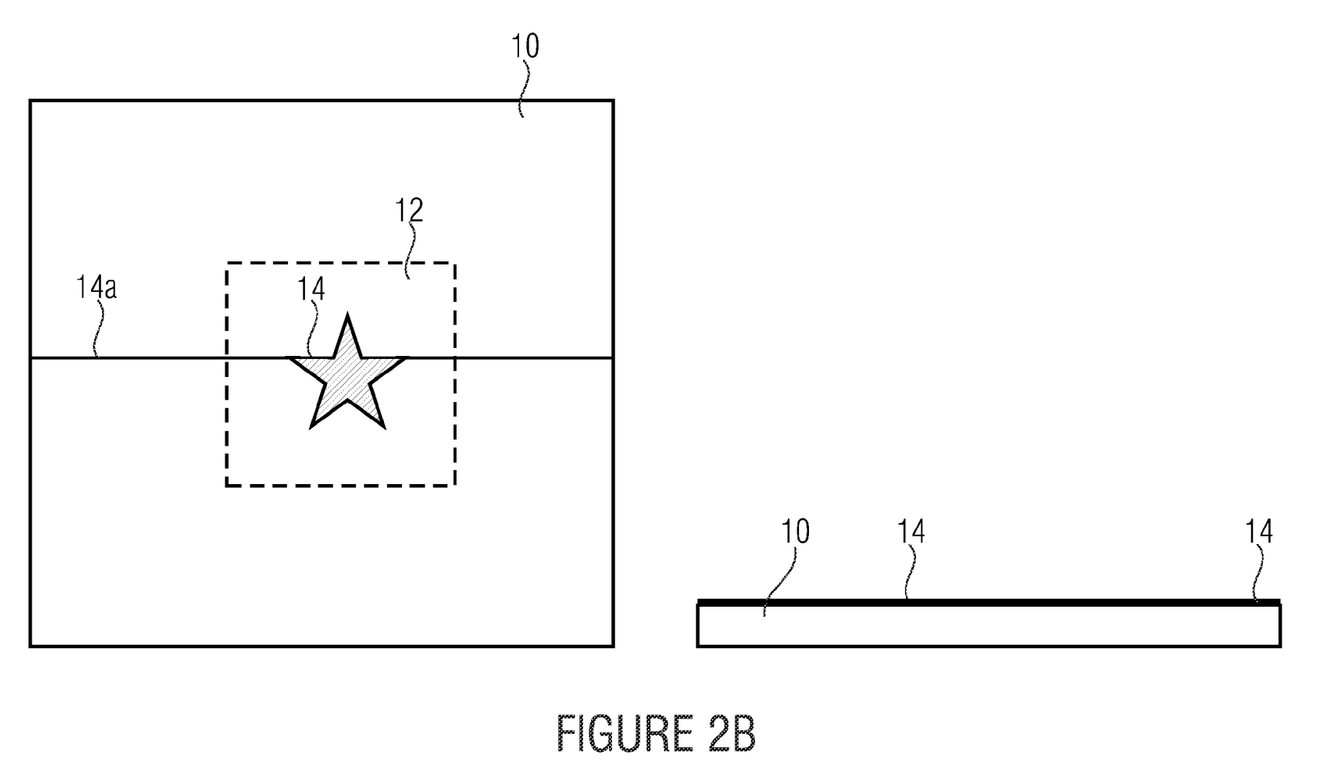
Figure 2C:
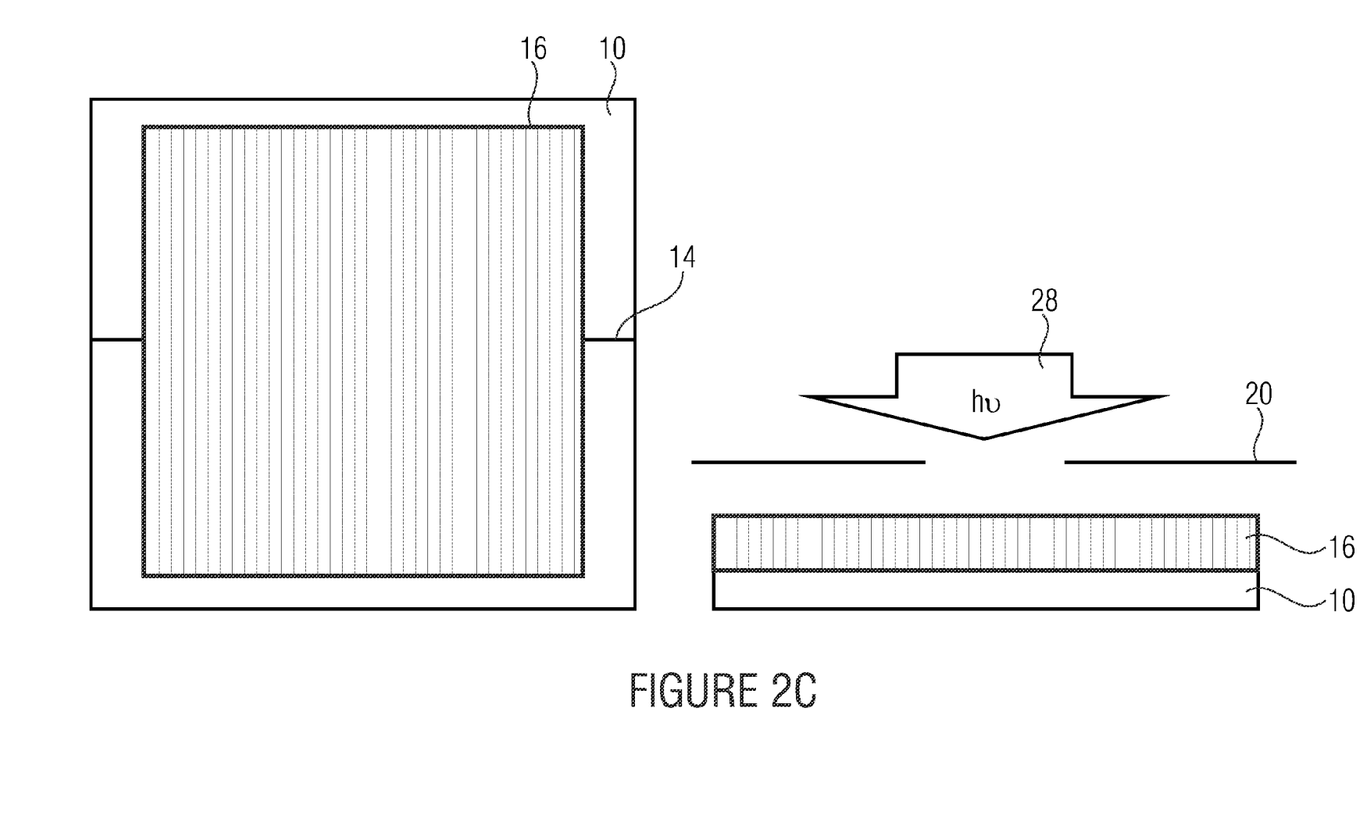

In the first process step 110 of the method 100, coating at least the active region 12 by a photoresist 16 takes place, as is illustrated in FIG. 2c. As a consequence, at least the active region 12 and the solid electrode 14 are covered, wherein the surface of the substrate 10 may also be covered completely. The lithographically patternable photoresist 16 may, for example, be TORAY, photoneece DL-1602, and either be cured locally by means of radiation 18, or dissolved locally, so as to selectively expose corresponding regions in a next step. In this embodiment, this is a so-called negative resist which is cured after being exposed to the radiation 18 such that same is not removed directly in another step. Advantageously, the photoresist layer 16 is applied at a relatively large layer thickness of, for example, 5 μm or, generally, more than 1 μm (or at least more than 0.5 μm) so as to ensure sufficient protection from damage of the underlying conductive track 14 in subsequent process steps. In order to separate the regions which are to remain as layer 16' relative to the edge regions 24, an exposure mask 20 is employed when exposing 18 the surface 16.

Figure 2D:
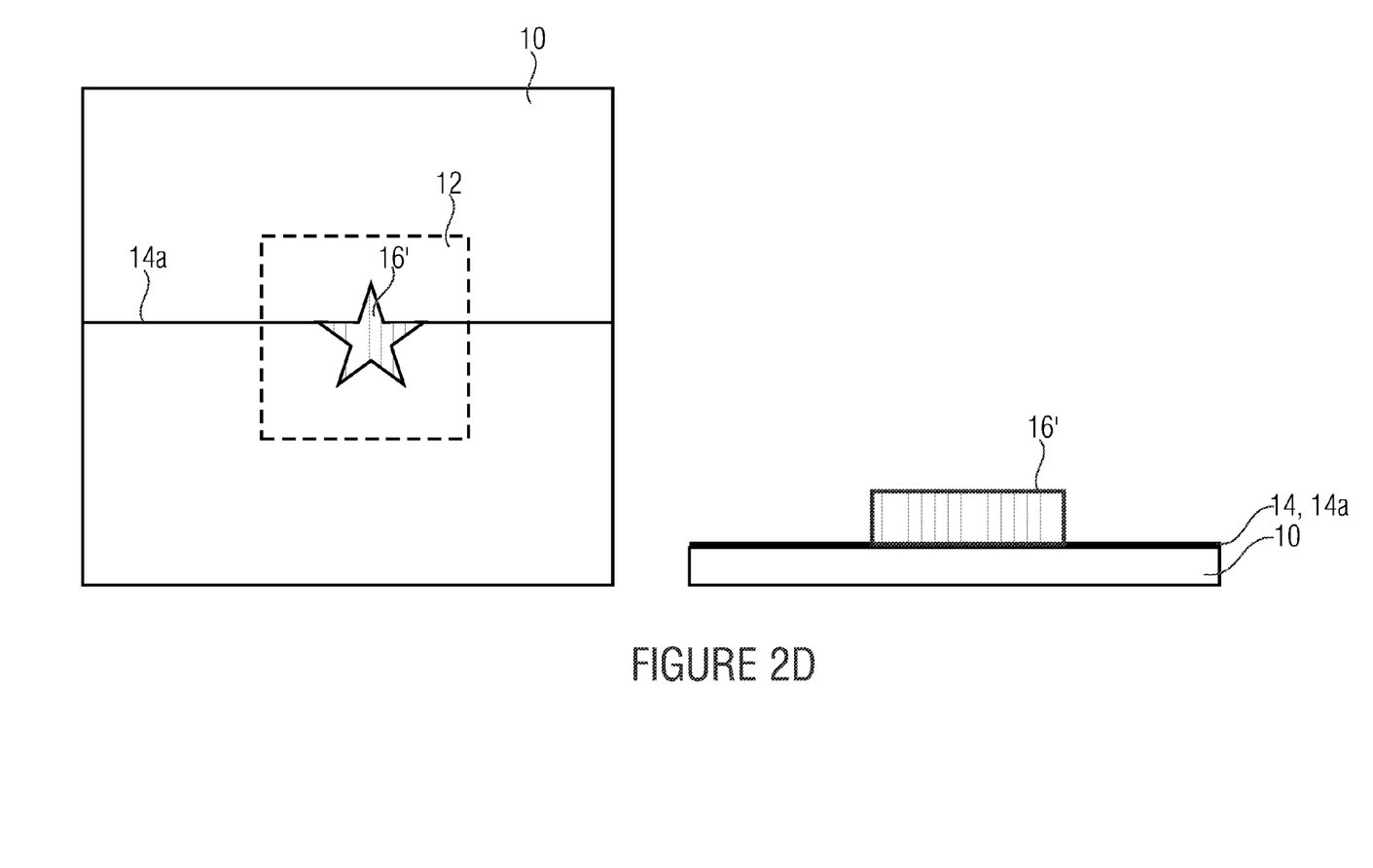

As may be recognized from the result in FIG. 2d, the exposure mask 20 may be shaped such that good shaping (exemplarily star) or, in particular, generating precise edges for the protective resist 16' is possible. FIG. 2d shows the finalization of the process step 120 of "removing the photoresist" 16 (cf. FIG. 1). This step may exemplarily be performed using solvents, wherein, generally, it is to be stated that different methods are known here which are typically dependent on the photoresist 16 used.

Figure 2E:
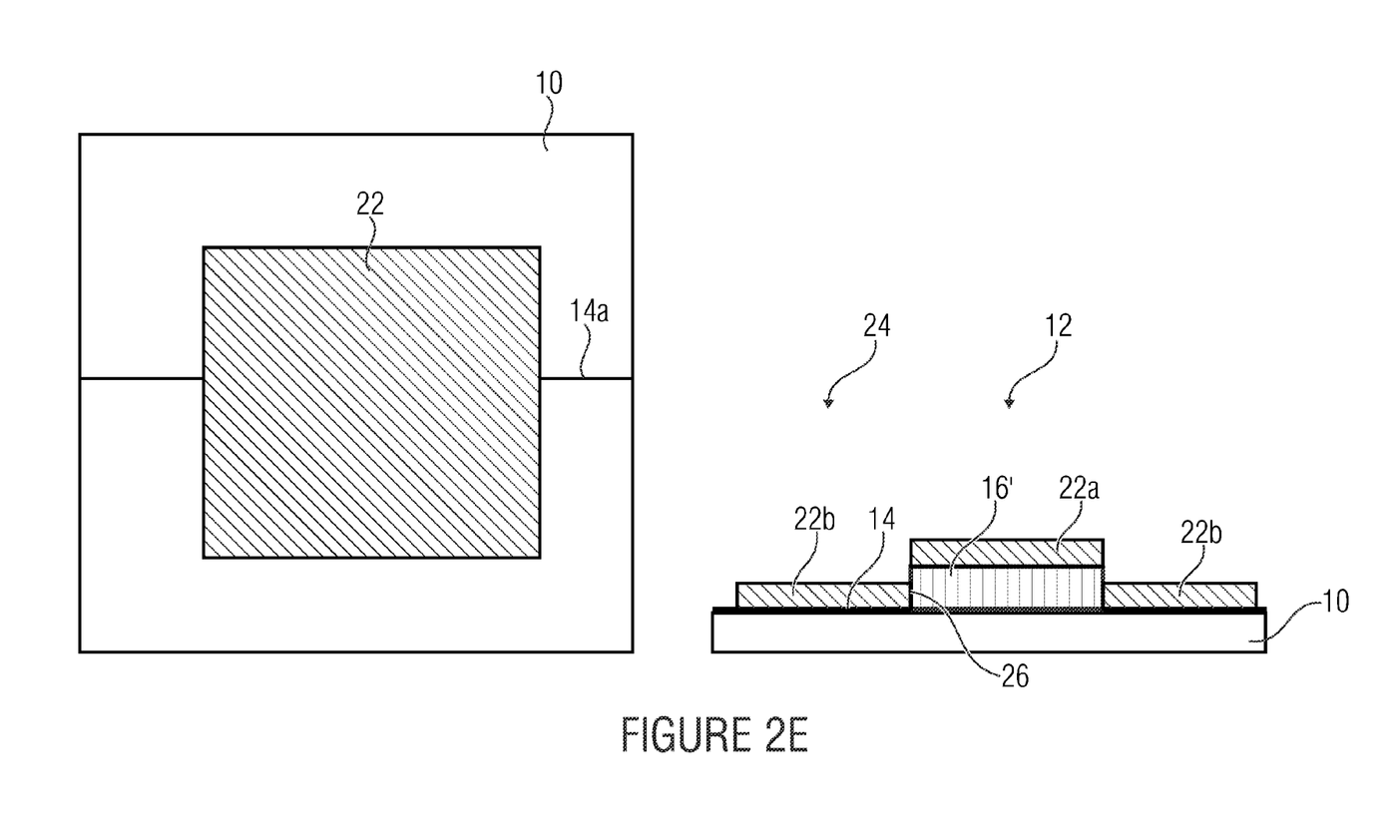

FIG. 2e illustrates the next method step 130 of "applying a passivation layer 22 onto the patterned surface of the substrate 10" or "onto the regions 14 and 16' applied onto the surface of the substrate 10". Different methods, such as, for example, sputtering, CVD or ALD methods or other vacuum deposition methods, may be used for applying the oxide layer 22 and 22b.

As is illustrated in FIG. 2e, the passivation layer 22 may be subdivided into different regions, i.e. the elevated regions 22a on the protective resist 16' and the regions 22b laterally next to the protective resist 16' and next to the electrode 14'. The layer region 22b remains on the substrate 10 and will later form the insulation or insulation edge. Examples of possible material are $Al_2O_3$, $SiO_2$ or other oxides, wherein, when choosing the material, the optical characteristics of layer 22 or 22b (exemplarily index of refraction, color, transparency, filter effect or reflection or anti-reflection characteristics) in particular are important apart from the insulation characteristics. Depending on the desired optical and electrical characteristics of the passivation layer 22b, material selection and process parameter setting take place. The layer thickness of the passivation layer 22 and 22b may also be adjusted by means of the process parameters, wherein exemplarily a layer thickness of roughly 200 nm or, generally, a layer thickness in a range from 50 nm to 100 nm (or from 1 nm to 500 µm) is strived for.

As has already been mentioned before, the goal of the method 100 described is providing high precision for the pattern and, in particular, when defining the active first region 12 relative to the second region 24 (surrounding the first region 12). This precision is produced in particular at the insulation edge 26, i.e. between the passivation layer 22b and the photoresist 16'. The parameters of deposition in step 130 with regard to layer stress, adhesion and/or pinhole-free insulation are optimized for reliable and insulating edges 26. The insulation edge 26 of the passivation layer 22b is produced in the next step where the protective resist 16' is removed together with the region 22a of the passivation layer 22. This step 140 is illustrated in FIG. 2f.

Figure 2F:
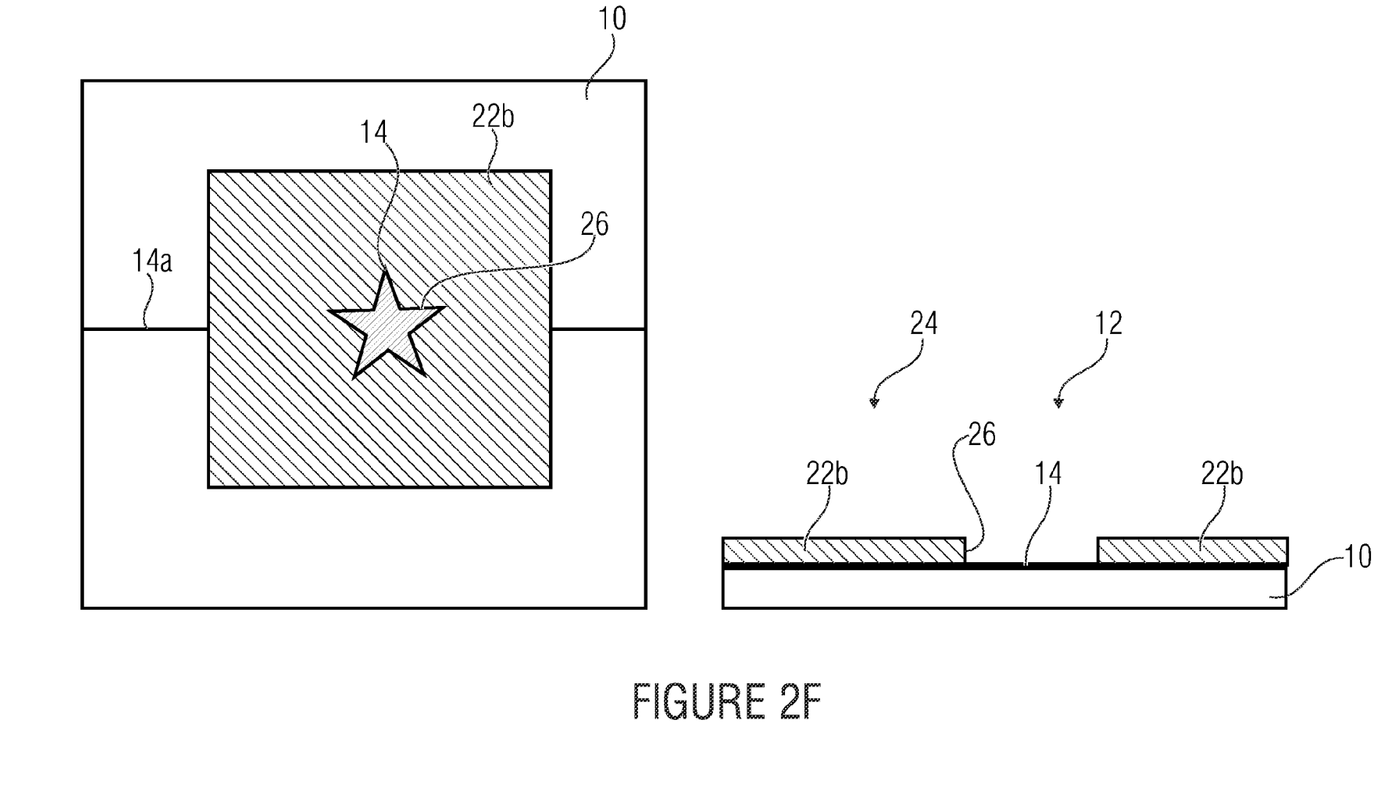

FIG. 2f shows the substrate 10 including the active layer 14 and the remaining regions 22b of the passivation layer 22. The region 22a of FIG. 2e is removed by the protective resist 16' being dissolved by means of a so-called lift-off process or by means of an ashing process. Since the layer 16', exemplarily with a thickness of 5 µm, is considerably thicker than the passivation layer 22b at, for example, 0.2 µm, the protective resist 16' including the passivation layer 22a thereon may exemplarily be removed by means of a solvent or by means of a dry-etching method in order to expose, for example, the active layer 14 (electrode) or, generally, the active region 12. Since the lift-off methods and ashing methods mentioned before selectively dissolve only the cured protective resist 16', the passivation layer region 22b will remain on the substrate 10, whereas the passivation layer region 22a, including the resist 16', is removed. This means that this method allows forming a sharp and precise edge 26 at the edge region of the passivation layer 22. It is pointed out that the edge 26 produced by means of sputtering patterning may narrow to a flat shape.

Since, when using the manufacturing method 100 described above, the photoresist 16' does not remain in the device, but only serves for protecting the active region while depositing the dielectric layer 22, improved optical and electrical characteristics may also be produced for very small structures. Further advantages are a considerable reduction in pollution and, thus, saving the complicated cleaning procedures before subsequently depositing further layers, or OLED deposition. The layer thicknesses of the patterns applied are also considerably smaller than with screen printing. Thus, the sputtered layers typically have a layer thickness of (at most) several 100 nm, whereas the printed individual layers exhibit a thickness of roughly 10 µm. This results in a considerable improvement as regards the requirements for an optional subsequent full-area encapsulation or thin-layer encapsulation.

With reference to FIG. 1 and, in particular, FIG. 2b, it is to be mentioned that the method 100 may comprise the optional step of applying the conductive track or contact region 14.

This method step may take place using lithography processes, printing processes or vacuum deposition techniques (sputtering or vapor deposition).

Figure 3A:
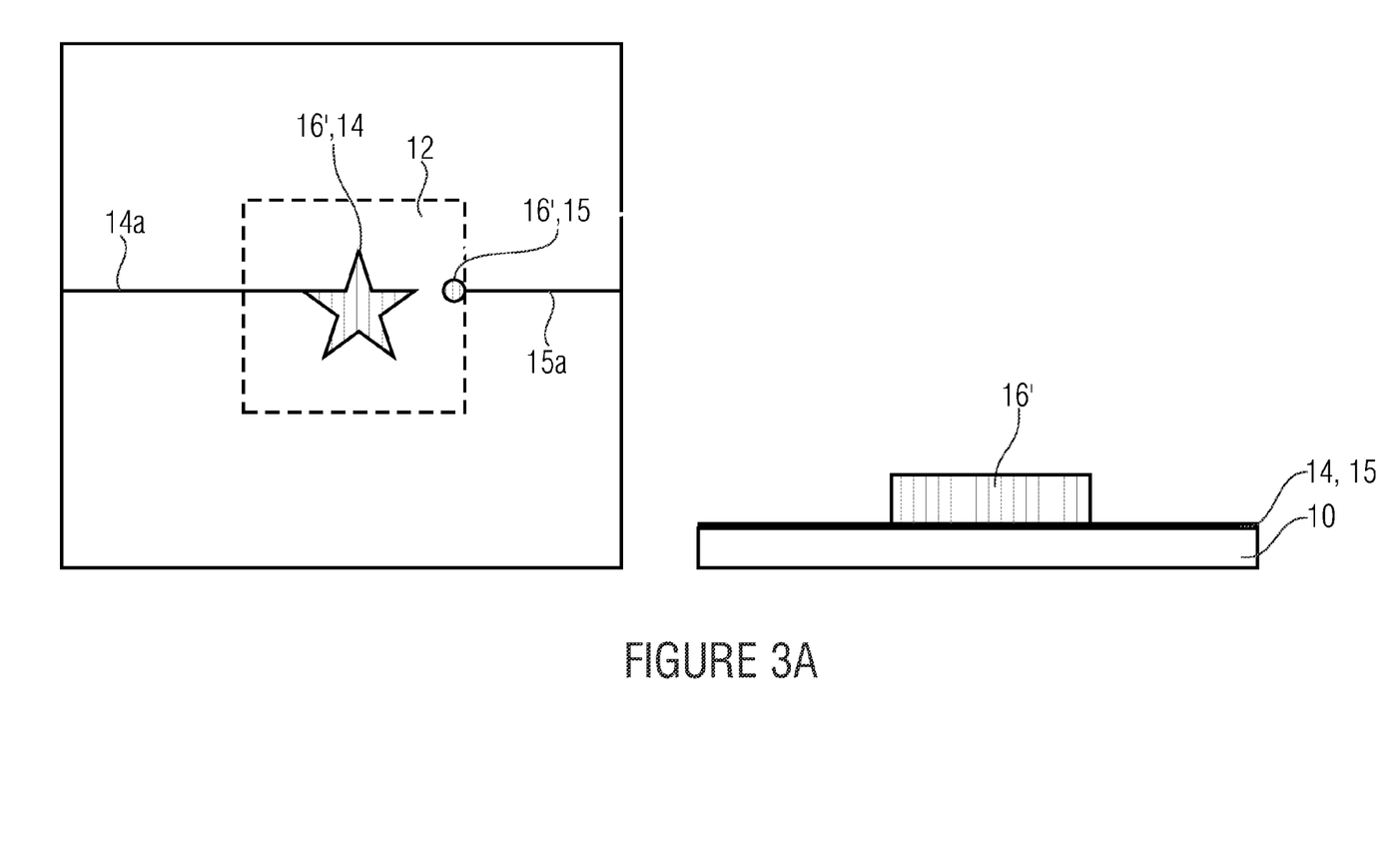
FIGS. 3a to 3d are further views of intermediate products of the device to be manufactured so as to illustrate optional steps of the manufacturing method in accordance with further embodiments.

Further optional steps of the method 100 will be discussed below referring to FIGS. 3a to 3e. Here, as illustrated in FIG. 3a, the starting situation is a photoresist 16' applied onto the electrode 14 and already patterned. It is to be pointed out here that the (bottom) electrode which in turn is connected via the feed line 14a, may exemplarily be implemented as an opaque bottom electrode (including metals, such as, for example, Ag, Al or Cu) such that an opaque device is manufactured, or may also be implemented to be transparent (exemplarily including ITO, PANI or thin metals) such that a transparent device may be manufactured.

As may be gathered from FIG. 3a, in addition to the solid bottom electrode 14, the active region 12 comprises a vertical feed line 15 for a top electrode to be applied later on (not illustrated) including a narrow feed line 15a, the vertical feed line 15 also being covered with the photoresist 16'. These narrow feed lines 15 and 15a may exemplarily include ITO or another metal or other material (cf. electrode material 14). As regards size, the electrode 15 is adjusted to the current consumption of the active element to be manufactured.

Figure 3B:
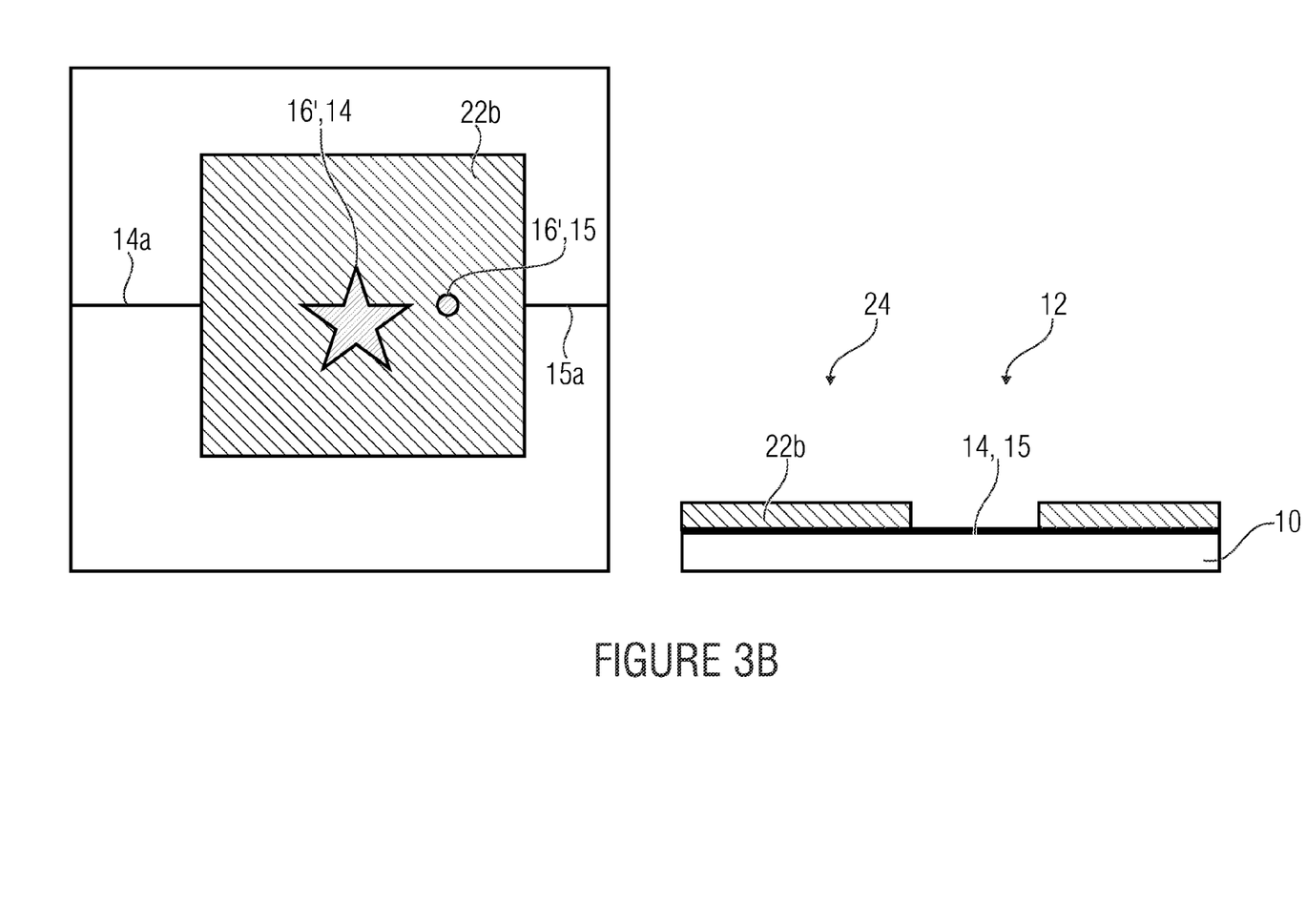

In a next step illustrated in FIG. 3b, deposition of the passivation layer 22 takes place, including a subsequent lift-off process 140, as has already been mentioned above. Consequently, the passivation layer 22b which is opened locally in the active region 12 or region of elements 14 and 15 remains on the substrate 10.

Figure 3C:
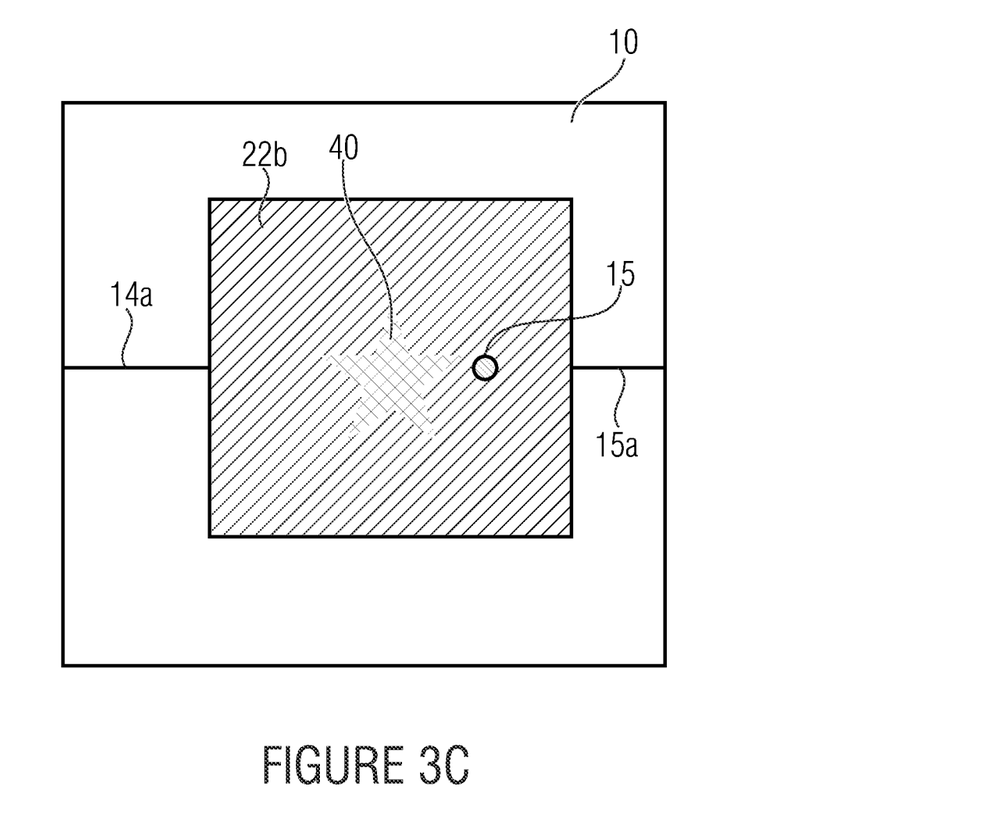

In a next step (cf. FIG. 3c), deposition of organics 14 or an organic layer 40 onto the electrode 14 takes place within the active region 12. It is to be mentioned that the optional vertical feed line 15 is not coated, since same serves for connecting the top electrode. This means that deposition of the organic layer 40 takes place in a patterned manner in the opened or active region 12. The active layer 40 provided in the active region 12 may exemplarily be a light-emitting layer, hole transport layer or other organic layer or organic layer stack, exemplarily at a thickness of 100 nm, wherein in OLEDs, for example, layer thicknesses are usually in the range from 50 nm to 1000 µm, and advantageously from 300 nm to 1000 nm.

Figure 3D:
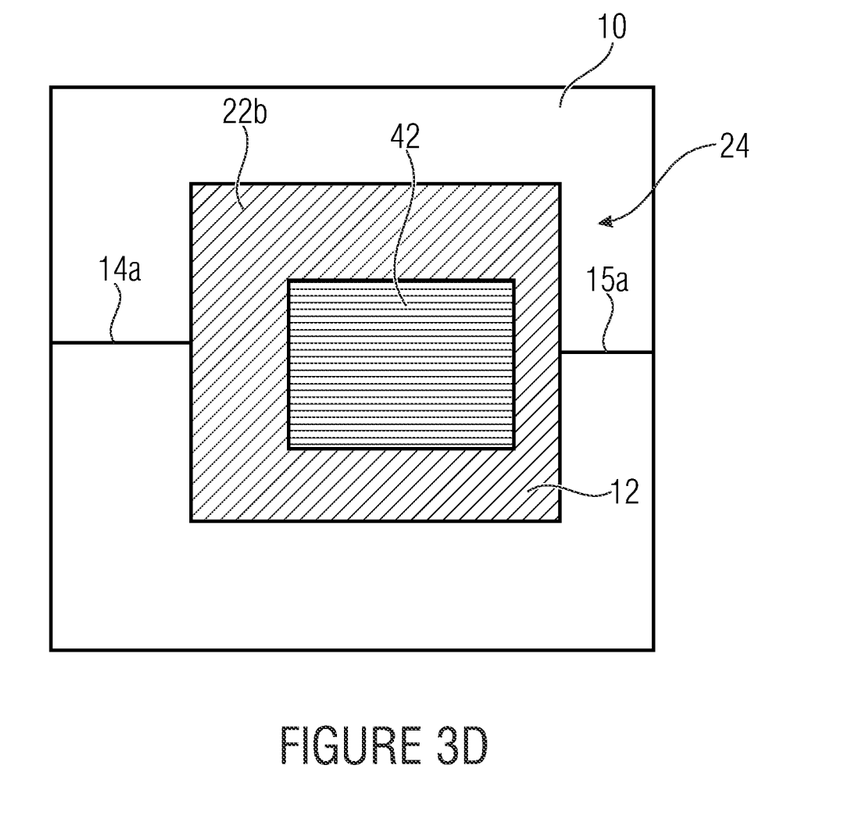

In a next step, applying the top electrode 42 onto the organic layer 40 takes place in the active region 12, simultaneously contacting same via the vertical feed line 15, as is illustrated in FIG. 3d. Here, the top electrode 42 may be implemented to be opaque such that, all in all, an opaque device is manufactured, irrespective of whether the bottom electrode 14 is transparent or non-transparent. In case the top electrode 42 is implemented to be transparent, a transparent device may be manufactured when using a transparent bottom electrode 14. Since, as has already been mentioned, no photoresist 16' is embedded in the device or at least in the active region 12, a high degree of transparency of, exemplarily, >40% or even >75% or 90%, can be achieved at least in the first region 12. The degree of transparency in the second region 24 may take similar or even higher values, since typically the oxide 22b used here is highly or even fully transparent.

In summary, it is to be stated that it is obvious for a person skilled in the art that further layers 40 and 42, such as, for example, for stacked OLEDs or for tandem solar cells, may follow the layers 22b and 14 applied by means of the method described before.

Figure 4A:
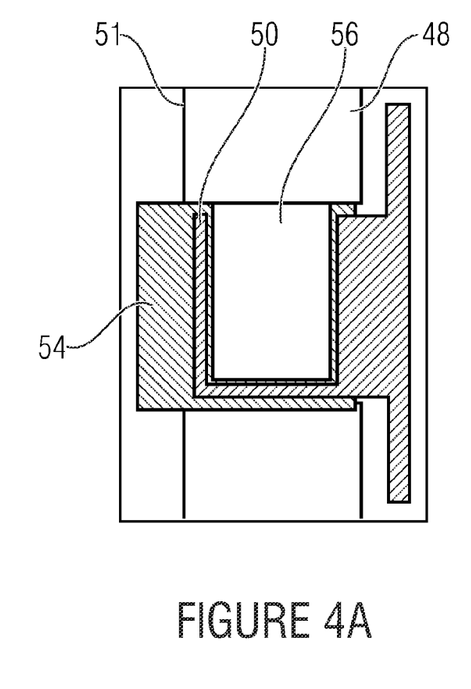
FIGS. 4a, 4b, and 4c are schematic and exemplary views of a layer applied by means of the manufacturing method.
Figure 4B:
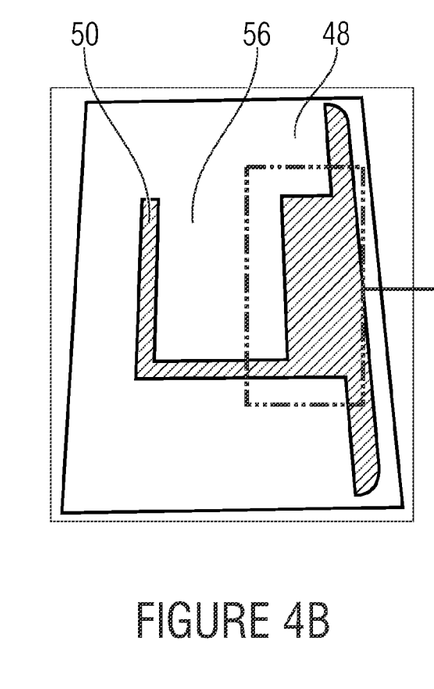
Figure 4C:
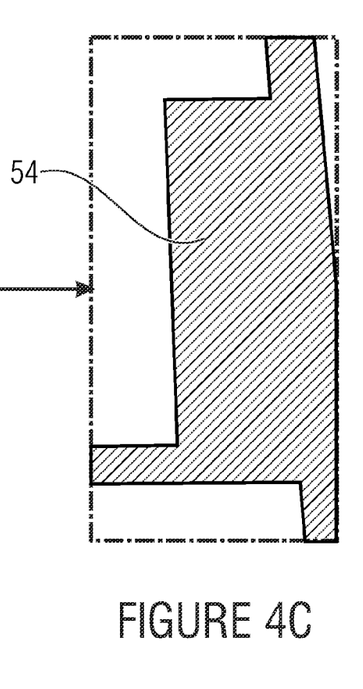

FIGS. 4a, 4b and 4c show a device, manufacturable by means of the method described before, comprising an electrode 50 arranged on a substrate 48 (exemplarily with a size of 35×50 mm$^2$). This ITO bottom electrode 56 (layer resistance 12 Ohm/nm) is subdivided into different potential regions by means of a 355 nm picosecond laser. The laser separation lines are provided with the reference numeral 51 (see schematic FIG. 4a). In order to reduce the ITO resistance, the conductive track made of 200 nm aluminum (layer resistance 0.18 Ohm/nm) has been applied by means of sputtering. A DC power of 500 watt may exemplarily be used for Al sputtering, the distance between target and substrate 48 exemplarily being 170 mm with a process time of 1100 seconds. It is to be mentioned here that it may be of advantage in large-area devices (OLED, OPV, etc.) to enhance the bottom electrode 50 using conductive tracks of an improved conductivity (such as, for example, Ag, Cu). This serves for compensating the comparatively high resistance of a transparent electrode (such as, for example, made of Al or Cu).

A 200 nm aluminum oxide layer having been deposited selectively above the aluminum conductive tracks 50 by means of reactive aluminum sputtering while using oxygen ($O_2$) serves for insulating the electrode 50. With this sputtering method, a DC power of 1000 watt is used, the distance between target and substrate 48 roughly being 200 mm with a process time of 6000 seconds. In this embodiment, masks have been used for coating, these being very rough structures of greater than 1 mm. Using corresponding shadow masks, however, structures smaller than 100 µm are possible.

Figure 5A:
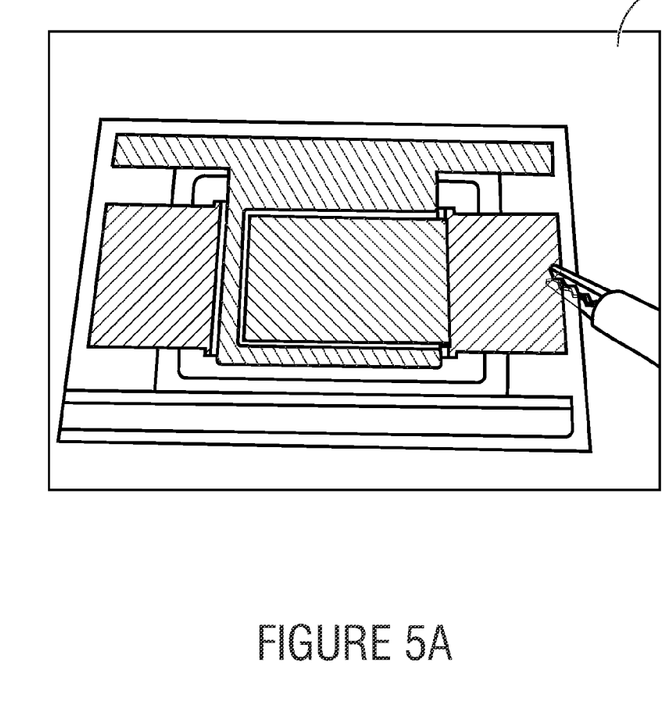
FIGS. 5a, 5b are exemplarily views of a PIN-OLED manufactured by means of the manufacturing method.
Figure 5B:
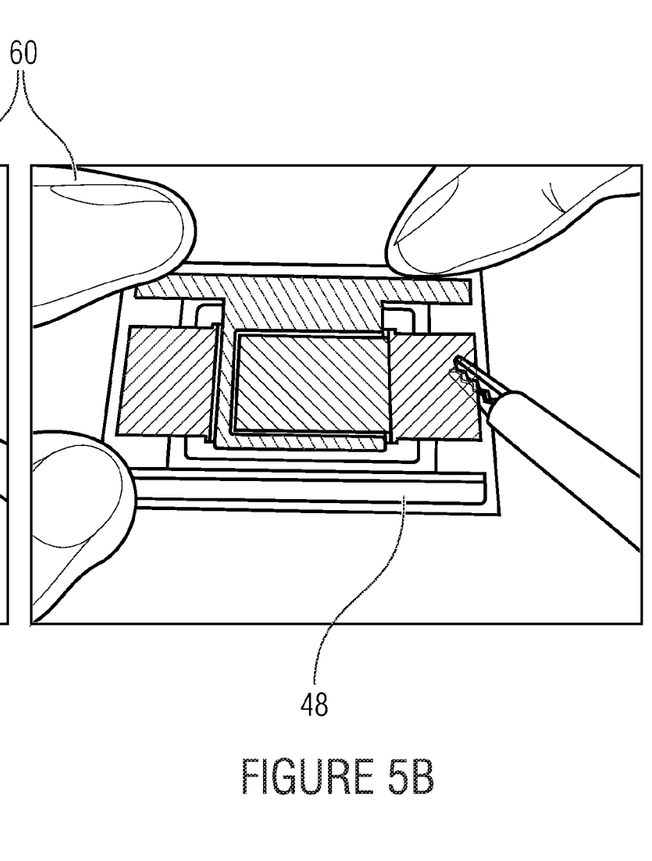
Figure 5C:
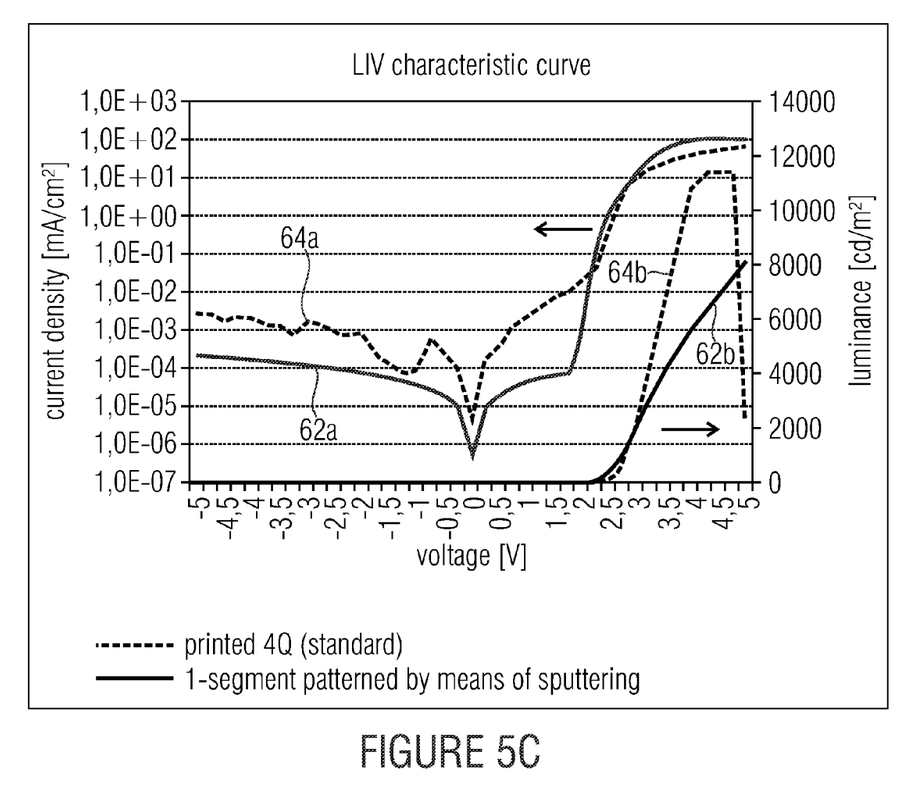
FIG. 5c illustrates a schematic comparison of two LIV characteristic curves so as to illustrate the electrical characteristics of an electrical device manufactured by means of the manufacturing method.

FIGS. 5a and 5b show two illustrations of a finished PIN-OLED 60 manufactured on a substrate 48 patterned by means of a sputtering process. An LIV characteristic curve for this PIN-OLED 60 is illustrated in FIG. 5c. FIG. 5c shows a chart in which current density on the one hand and luminance on the other hand are plotted relative to the voltage for two different OLEDs. Curve 62b for a sputtered 1-segment illustrates the luminance, whereas curve 62a illustrates the current density. In analogy, curve 64b illustrates the luminance for the printed 4Q (standard) element, whereas curve 64a shows the respective current density. The following standard values, illustrated in the table below, referenced to 1000 cd/m$^2$ result:

|  | sputter OLED | standard OLED |
| --- | --- | --- |
| CE [cd/A] | 24.00 | 19.96 |
| PE [lm/W] | 27.80 | 22.49 |
| EQE in [%] | 17.35 | 14.60 |
| CIEx | 0.620 | 0.626 |
| CIEy | 0.376 | 0.371 |

It is mentioned here that the values indicated for the standard OLED represent mean values of 16 individual segments. As can be recognized from the characteristic curves 62a, 62b, 64a and 64b, considerably smaller leakage currents (exemplarily at −5 V) may be realized in the OLEDs manufactured by means of sputtering patterning. This contributes to increasing the efficiency (cf. table).

Even when, in the above embodiments, individual aspects have been described particularly in connection with a certain method, it is to be pointed out that these aspects also represent a description of the product to be manufactured. Further embodiments thus relate to an organic device comprising an active first region, an active second region adjacent to the active first region, and a passivation layer in the second region. The electrical device, in the active region, exhibits a degree of transparency of more than 40%.

It is to be pointed out that aspects having been described in connection with a device also represent a description of the respective method or method step.

Further embodiments relate to applications of the organic device, exemplarily as an organic light-emitting diode. Exemplarily, organic light-emitting diodes may be used as display elements, exemplarily 7-segment display for the active illustration of information. This display may exemplarily be integrated in an optical viewfinder of a camera. Here, the method described above is particularly suitable since small structures, such as, for example, for cross lines in the optical viewfinder, may be manufactured. It would also be conceivable to manufacture a non-active display using the method described above, in which the layer described before as the bottom electrode represents the metallic cross or cross lines in the viewfinder. Here, structuring the visible structure may take place together with patterning the bottom or base electrode, when starting from a metal-coated substrate.

It is to be stated generally that the application thereof is not limited to organic light-emitting diodes. This means that further embodiments relate to organic field-effect transistors, organic photovoltaic elements, organic photodetectors or organic photodiodes. In particular in optical elements, such as, for example, organic photovoltaic elements, the improved optical characteristics (transparency in the top layers and reflection of the light at the passivation layer 22 or bottom electrode 14) may be made use of.

Even when, in embodiments described above, a vertical organic electrical device has been assumed, it is to be pointed out here that a lateral (transistor) structure may also be manufactured using this method of manufacturing. Exemplarily, the electrode described before as the bottom electrode 14 may be a gate electrode onto which the gate dielectric 22 is deposited such that a gate region is formed which may be driven in layers applied above same using the gate electrode 14. A reverse setup would also be conceivable, i.e. a setup in which the transistor structure has already been applied onto the substrate 10 before applying the gate dielectric 22. Thus, it is to be pointed out in relation to FIG. 2a that the active region 12 may also comprise active structure having been introduced already, such as, for example, a source region, a drain region, a gate region or, generally, a semiconductor region.

With regard to FIG. 2e, it is to be pointed out that a positive resist 16 dissolved by means of radiation 18 may also be employed instead of the negative resist. In this case, an inverted mask 20 is used.

With regard to FIG. 2e, it is pointed out that applying the passivation layer 22, in correspondence with further embodiments, may additionally take place in a patterned manner, exemplarily with the aid of a shadow mask, so that the passivation layer 22a and/or 22b may exemplarily be limited locally in the edge regions 24.

In correspondence with further embodiments, the method described in connection with FIG. 1 may comprise another step of post-processing the patterns after step 140 so as to remove elements (fences) having remained after the lift-off process, which may, for example, result in contact problems. Technologies suitable for this are plasma treatment (dry etching). The respective technology selected is dependent on the material used.

It is to be mentioned additionally that, optionally, (in particular with solid devices, such as, for example, the OLEDs or OSCs shown in FIGS. 5a and 5b) after patterning, exemplarily by means of screen printing, laser ablation, ink jetting, aerosol jetting, etching, engraving onto a rigid or flexible substrate, cleaning is made easier since there is only one layer 14 on the substrate 10. Said cleaning may exemplarily be done by a heating/tampering or drying procedure. Subsequently, transfer into vacuum takes place wherein an insulating transparent layer is deposited through an optional mask, exemplarily using ALD, CVD, eBeam or reactive sputtering. It is to be pointed out that no mask is used with ALD, but the insulator 22 is deposited over the entire area and subsequently the layer 22 is removed selectively by dry etching (maybe using a mask) by means of plasma.

With regard to FIG. 2, it is also to be mentioned that the passivation layer 22b may also be employed as a barrier against humidity or gases, i.e., in particular, in the edge regions. This also allows using the method described before for adjusting a layer for (thin-layer) encapsulation, exemplarily having been manufactured by means of ALD, CVD or by means of laminating a film, or as a cover glass.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for manufacturing an organic device, comprising:
    applying a photoresist onto at least an active first region arranged on a substrate of the organic device;
    removing the photoresist from the substrate in a second region adjacent to the active first region;
    applying a passivation layer onto the first and second regions over the entire area; and
    removing the photoresist and the passivation layer in the active first region so as to generate an insulation edge in the passivation layer;
    wherein removing the photoresist from the substrate in the second region comprises a lithography process.

2. The method in accordance with claim 1, wherein removing the photoresist and the passivation layer takes place by means of a lift-off process.

3. The method in accordance with claim 2, wherein the lift-off process comprises wet-chemical etching the photoresist.

4. The method in accordance with claim 1, wherein removing the photoresist and the passivation layer takes place by means of an ashing process.

5. The method in accordance with claim 4, wherein the ashing process comprises $O_2$ plasma etching the photoresist.

6. The method in accordance with claim 1, comprising applying a contacting layer before applying the photoresist so as to form a first portion of the active region.

7. The method in accordance with claim 1, comprising depositing at least an organic layer onto at least the active first region after removing the photoresist and the passivation layer in the first region so as to form another portion of the active first region.

8. The method in accordance with claim 7, comprising applying another metallization layer onto the at least one organic layer.

9. The method in accordance with claim 1, comprising exposing the photoresist in the active first region.

10. The method in accordance with claim 1, wherein applying the passivation layer comprises a sputtering process, vacuum deposition process and/or atomic layer deposition process.

11. A method for manufacturing an organic device, comprising:
    applying a photoresist onto at least an active first region arranged on a substrate of the organic device;
    removing the photoresist from the substrate in a second region adjacent to the active first region;
    applying a passivation layer onto the first and second regions over the entire area; and
    removing the photoresist and the passivation layer in the active first region so as to generate an insulation edge in the passivation layer;
    wherein removing the photoresist and the passivation layer takes place by means of an ashing process.

12. A method for manufacturing an organic device, comprising:
    applying a photoresist onto at least an active first region arranged on a substrate of the organic device;
    removing the photoresist from the substrate in a second region adjacent to the active first region;
    applying a passivation layer onto the first and second regions over the entire area; and
    removing the photoresist and the passivation layer in the active first region so as to generate an insulation edge in the passivation layer; and
    depositing at least an organic layer onto at least the active first region after removing the photoresist and the passivation layer in the first region so as to form another portion of the active first region.

* * * * *